United States Patent
Gruodis et al.

[11] Patent Number: 6,154,865
[45] Date of Patent: Nov. 28, 2000

[54] INSTRUCTION PROCESSING PATTERN GENERATOR CONTROLLING AN INTEGRATED CIRCUIT TESTER

[75] Inventors: Algirdas Joseph Gruodis, Wappinger Falls, N.Y.; Philip Theodore Kuglin, Tualatin, Oreg.

[73] Assignee: Credence Systems Corporation, Fremont, Calif.

[21] Appl. No.: 09/191,777

[22] Filed: Nov. 13, 1998

[51] Int. Cl.[7] .......................... G01R 31/28; G06F 11/00
[52] U.S. Cl. .......................... 714/743; 712/242
[58] Field of Search .................... 714/738, 743; 712/242, 243

[56] References Cited

U.S. PATENT DOCUMENTS

| | | | |
|---|---|---|---|
| 4,041,462 | 8/1977 | Davis et al. | 364/200 |
| 4,057,850 | 11/1977 | Kaneda et al. | 364/200 |
| 4,173,782 | 11/1979 | Dixon | 364/200 |
| 4,313,200 | 1/1982 | Nishiura | 371/25 |
| 4,493,045 | 1/1985 | Hughes, Jr. | 364/580 |
| 5,321,701 | 6/1994 | Raymond et al. | 371/27 |
| 5,337,045 | 8/1994 | Shirasaka | 340/825.52 |

*Primary Examiner*—Albert De Cady
*Assistant Examiner*—Samuel Lin
*Attorney, Agent, or Firm*—Daniel J. Bedell; Smith-Hill and Bedell

[57] ABSTRACT

A pattern generator for an integrated circuit tester includes an instruction memory storing addressable instructions (INST) and reading out each instruction when addressed by an address (ADDR) supplied as input thereto. An instruction processor receives each instruction read out of the instruction memory and alters the address input to the instruction memory in accordance with the received instruction so that the instruction memory reads out a next instruction. The instruction processor, which includes a conventional return address stack, is capable of executing conventional address increment, call and return instructions. The instruction processor is also capable of executing a temporary return instruction (TEMP) by incrementing its current address output to produce a new return address, by setting its address output to the value of a return address previously saved in the stack, by popping the saved return address from the stack, and by pushing the new return address onto the stack. Temporary return instructions enable instruction program flow to pass back and forth between a main program and a called subroutine.

20 Claims, 3 Drawing Sheets

INSTRUCTION PROCESSING PATTERN GENERATOR CONTROLLING AN INTEGRATED CIRCUIT TESTER

BACKGROUND OF THE INVENTION

1. Field of the Invention

The present invention relates in general to an instruction processing pattern generator controlling operations of an integrated circuit tester, and in particular to an instruction processor that implements subroutine parameter passing.

2. Description of Related Art

A typical "per pin" integrated circuit (IC) tester includes a separate channel for each pin of an IC device under test (DUT). A test is organized into a succession of test cycles and during each test cycle each channel carries out a test activity at the pin. A vector (a data word) supplied to each channel at the start of each test cycle indicates what the channel is to do during the test cycle. For example when a channel is to provide a test signal input to the pin, an input vector may tell it to change the state of the test signal at some particular time during the test cycle. When a channel is to sample a DUT output signal appearing at the pin to determine if it is of an expected state, the vector indicates when to sample the DUT output signal during the test cycle and indicates its expected state.

A typical per pin IC tester also includes a separate random access memory for each channel for storing all of the vectors the channel needs during the test. A central instruction processor, executing a program stored in a central instruction memory, supplies an address in common to the instruction memory and to all vector memories before the start of each test cycle. The instruction memory responds to the address by reading out a next instruction to be executed. Each vector memory responds to the address by reading out the vector stored at that address and supplying it to its corresponding tester channel at the start of a test cycle. Thus a sequence of instructions read out of the instruction memory tells the instruction processor how to generate a sequence of addresses, and that sequence of addresses causes each vector memory to read out a sequence of vectors to a corresponding tester channel.

Each vector memory may store the sequence of vectors needed for a test at sequential memory addresses. In such case each instruction read out of the instruction memory need only tell the instruction processor to increment the vector/instruction memory address for the next test cycle. However when a test requires a large number of test cycles, the number of instructions and vectors needed may exceed the capacity of the instruction and vector memories.

Fortunately most long tests involve repetitive operations in which certain vector sequences are repeated many times and each vector sequence that is to be repeated need be stored just once in vector memory. In such case a program stored in the instruction memory can be organized into a main program and a set of callable subroutines and the vectors stored in the vector memories are similarly organized into a main vector sequence and a set of subroutine sequences. During the test, as the instruction processor steps through the main program sequence, it sequentially read addresses the vectors of the main vector sequence. Whenever a repeatable subroutine sequence of vectors is needed, a CALL instruction input to the instruction processor tells it to jump to the first address of the vector sequence and of a corresponding instruction subroutine. The subroutine tells the instruction processor to sequentially address the vectors of the subroutine sequence. The last instruction of the subroutine is a RETURN instruction telling the instruction processor to return to the main program address following the address of the CALL instruction. Since each repetition of a vector sequence can be referenced by a pair of CALL and RETURN instructions in the main program, the amount of instruction and vector memory needed for a long, repetitive test is reduced.

Certain types of tests involve a long "mostly repetitive" sequence of vectors which might be completely repetitive except that one or more vectors differ on each pass of the sequence. For example when the DUT we test is a random access memory, we write data to each DUT memory address, read the data back out of that DUT address, and then compare the data written to the DUT address to the data read back out to see if they match. The operations of writing, reading and comparing are repetitive except that during each repetition of the process the DUT memory address being write and read accessed changes. In order to handle this "mostly repetitive" process using subroutines, it has been necessary to divide the process into several subroutines, each covering those portions of the process which are completely repetitive. The non-repetitive portions of the process, the generation of DUT write and read addresses, are handled by the main program. Thus several subroutines are needed to implement a long, mostly repetitive, process having an occasional non-repetitive section.

Subroutine calls have been handled using either direct or indirect addressing. In direct addressing the full starting address of a subroutine is included as an operand with the CALL instruction. Direct addressing allows the address space of the instruction memory to be freely subdivided into as many subroutines as may be needed. Dividing a long, "mostly repetitive" process into many subroutines is not a problem. However one disadvantage to direct addressing is that it requires the instruction memory to be wide enough to store a large operand with each CALL instruction. For example a 16 Mbyte instruction memory requires a 24-bit input address. Thus in a direct addressing system having a 16 Mbyte instruction memory, the instruction memory, in addition to having to store for example a 4-bit instruction opcode at each address, must also store a 24-bit operand for use as a call address.

In indirect addressing, the opcode stored with each CALL instruction only indirectly indicates the address of a subroutine being called. The instruction processor uses a decoder or lookup table to convert the operand into the actual address of the subroutine. For example, a 4-bit operand can reference up to sixteen subroutine start addresses. The advantage to indirect addressing is that it greatly reduces the size of the operand that must be stored in the instruction memory and therefore greatly reduces the width of the instruction memory.

The disadvantage to indirect addressing is that it limits the number of subroutines that can be stored and called. When we employ indirect addressing, where we can call only a limited number of subroutines, it may not be possible to break up a long "mostly repetitive" instruction sequence into several subroutines. What is needed is an instruction processor that can implement a long "mostly repetitive" sequence of instructions as a single subroutine in which non-repetitive sections of the subroutine can be altered with each pass of the subroutine.

SUMMARY OF THE INVENTION

A pattern generator for an integrated circuit (IC) tester in accordance with the present invention includes an instruction memory storing addressable instructions and for reading out each instruction when addressed by an address supplied as input thereto. An instruction processor receives each instruction read out of the instruction memory and alters the address input to the instruction memory in accordance with the received instruction so that the instruction memory reads out a next instruction.

The pattern generator also includes a set of vector memories also addressed by the address output of the instruction process each for storing and reading out a sequence of addressed vectors for controlling activities of the IC tester during a test.

The instruction processor, which includes a conventional return address stack, is capable of executing conventional address increment, call and return instructions. In accordance with one aspect of the invention, the instruction processor is also capable of executing a "temporary return" instruction by incrementing its current address output to produce a new return address, by setting its address output to the value of a return address previously saved in the stack, by popping the saved return address from the stack, and by pushing the new return address onto the stack.

Temporary return instructions may be used, for example, to enable instruction program flow to temporarily pass back to a main instruction program from a called subroutine while the subroutine is being executed. This capability is useful because it allows a single subroutine to implement all repetitive portions of a long "mostly repetitive" sequence of instructions, with non-repetitive sections of the instruction sequence being handled by the main program.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in block diagram form an integrated circuit (IC) tester employing an instruction processor-based pattern generator in accordance with the present invention, FIG. 2 illustrates the instruction processor of FIG. 1 in more detailed block diagram form, FIG. 3 illustrates an example arrangement of main program and subroutine instructions as they appear in portions of the address space of the instruction memory of FIG. 1, FIG. 4 illustrates an example of an arrangement of main program instructions as they would appear in a portion of the address space of the instruction memory of FIG. 1 for the alternative embodiment of the instruction processor of FIG. 1, and FIG. 5 illustrates in block diagram form an alternative embodiment of an integrated circuit (IC) tester in accordance with the present invention.

DESCRIPTION OF THE PREFERRED EMBODIMENT(S)

Figure 1:
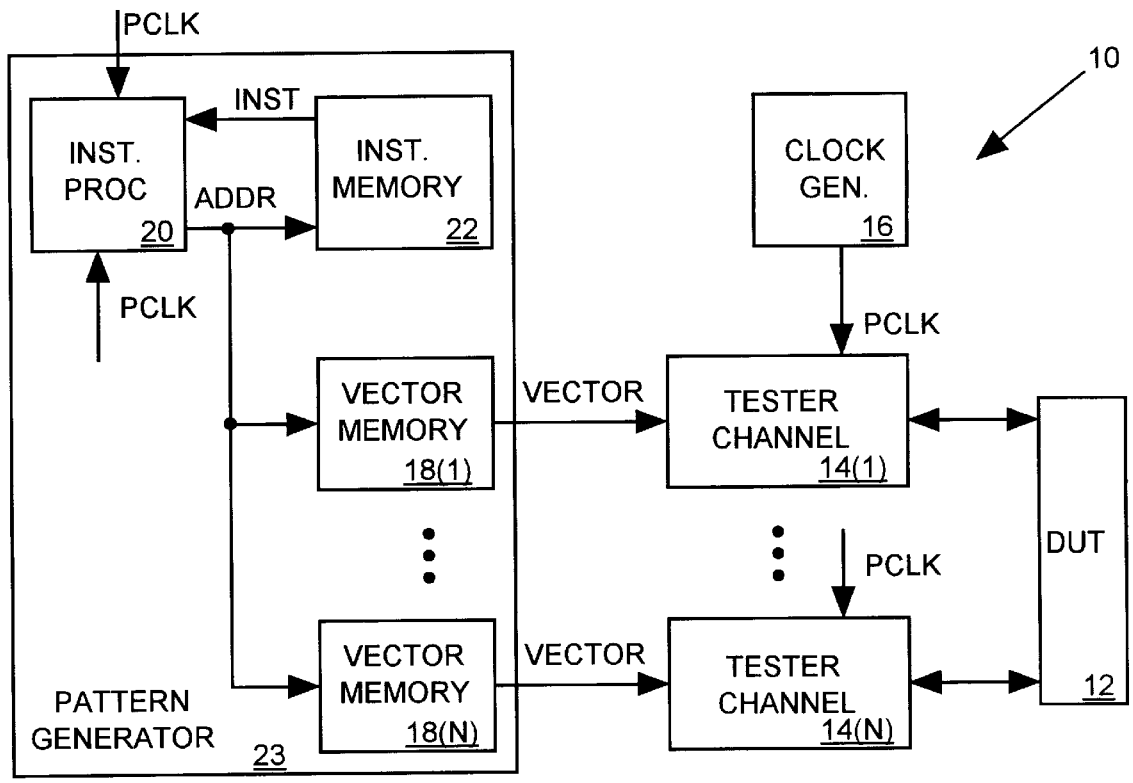

FIG. 1 illustrates in block diagram form an integrated circuit (IC) tester 10 in accordance with the present invention for testing an IC device under test (DUT) 12. Tester 10 includes a set of N tester channels 14(1)–14(N), each corresponding to a separate pin of DUT 12. A test is organized into a succession of test cycles and during each test cycle each channel 14 carries out a test activity at the corresponding DUT pin. A central clock signal generator 16 generates a periodic clock signal PCLK marking the start of each test cycle. A vector (a data word) supplied to each channel 14 before the start of each test cycle indicates what the channel is to do during the test cycle. Each tester channel 14 responds to each successive PCLK pulse by reading its input vector and carrying out the indicated action during the following test cycle.

When a vector indicates that a channel 14 is to provide a test signal input to the pin, the vector tells it when and how to change the state of the test signal during the test cycle. When a channel 14 is to sample a DUT output signal appearing at the pin to determine if it is of an expected state, its input vector indicates when the channel 14 is to sample the DUT output signal during the test cycle and also indicates its expected state.

Tester 10 also includes a set of N addressable vector memories 18(1)–18(N), each corresponding to a separate channel 14(1)–14(N) and each storing all of the vectors the corresponding channel needs during the test. A central instruction processor 20 responds to each PCLK signal pulse by reading an instruction (INST) out of a central instruction memory 22 and executing that instruction. The instruction tells instruction processor 20 to supply an address in common to all vector memories 18(1)–18(N) before the start of each test cycle. Each vector memory 18 responds to the address by reading out a vector stored at that address and supplying it to its corresponding tester channel 14 at the start of a test cycle. The address generated by instruction processor 20 also read addresses instruction memory 22 causing it to read out a next instruction to be executed. The instructions stored in instruction memory 22 are an algorithmic program for telling instruction processor 20 to generate a sequence of addresses, each address corresponding to a separate test cycle and causing each vector memory 18 to supply a vector to a corresponding tester channel 14 for controlling its activities during that test cycle. Instruction processor 20, instruction memory 22, and vector memories 18(1)–18(N) therefore together form a large pattern generator 23 to provide a sequence of vectors to each tester channel 14(1)–14(N) during the test.

Each vector memory 18 may store the sequence of vectors needed for a test at sequential memory addresses. In such case each instruction INST read out of instruction memory 22 simply tells instruction processor 20 to increment its output memory address for the next test cycle. However when a test requires a large number of test cycles, the number of instructions and vectors needed may exceed the capacity of the instruction and vector memories 22,18. Fortunately most long tests involve repetitive operations in which certain instruction sequences, and the vector sequences they invoke, are repeated many times. In such case, each instruction sequence, and the vector sequence it invokes, need be stored just once in instruction memory 22 and vector memory 18. The program stored in instruction memory 22 includes a "main" program and up to sixteen instruction subroutines that may be called by the main program. Similarly the vectors stored in each vector memory 18 include a main vector sequence invoked by the main program and up to sixteen subroutine vector sequences, each corresponding to a separate subroutines.

Figure 2:
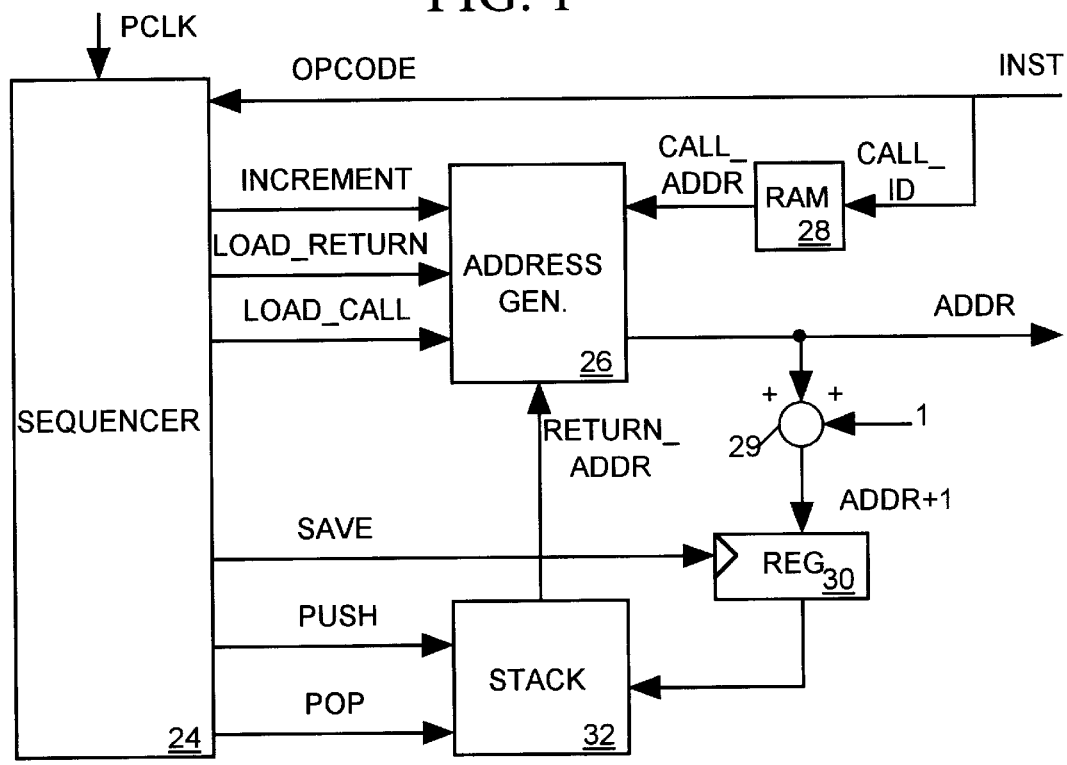

FIG. 2 illustrates instruction processor 20 of FIG. 1 in more detailed block diagram form. Each instruction (INST) read out of instruction memory 22 includes an opcode field and an operand. The opcode provides an input to a sequencer 24 controlling a conventional address generator 26, an arithmetic logic unit that produces the instruction processor's output address ADDR. In response to control signal inputs from sequencer 24, address generator 26 can either increment its current output address ADDR, set it equal to an input call address (CALL_ADDR), or set it equal to an input return address (RETURN_ADDR).

When sequencer 24 pulses an INCREMENT signal to signal address generator 26, the address generator increments its current output address.

When the opcode is a CALL opcode invoking one of the instruction subroutines, a 4-bit operand included in the instruction is a "call ID" referencing the called subroutine. The call ID addresses a RAM 28 having sixteen addressable storage locations, each containing the 24-bit starting address of a separate one of sixteen subroutines that may be stored in instruction memory 22 of FIG. 1. When addressed by a call ID, RAM 28 reads out the address (CALL_ADDR) of the subroutine being called to address generator 26. Sequencer 24 can tell address generator to load a call address CALL_ADDR by pulsing a LOAD_CALL signal input to address generator 26. Address generator 26 then sets its current output address ADDR to the call address CALL_ADDR. Thus the call ID is small 4-bit "indirect" subroutine address that references a much larger "direct" subroutine address.

A conventional "push/pop" address stack 32 supplies address generator 26 with the return address (RETURN_ADDR) Instruction processor 20 also includes an incrementer 29 for incrementing the output address ADDR of address generator 26 to supply an input ADDR+1 to a register 30 clocked by a SAVE signal output of sequencer 24. The address saved in register 30 is supplied as input to stack 32. When sequencer 24 pulses a PUSH signal input to stack 32, stack 32 pushes the address stored in register 30 on the top of its stack. When sequencer 24 pulses a POP signal input to stack 32, stack 32 pops an address off the top of its stack. Stack 32 supplies the address currently on the top of its stack as the return address (RETURN_ADDR) to address generator 26.

The set of instruction opcodes that may be executed by sequencer 24, and the manner in which sequencer 24 executes each opcode, are described below.

INC

When the current instruction input to instruction processor 20 includes an INC opcode, sequencer 24 pulses an INCREMENT signal input to address generator 26 in response to a next pulse of the PCLK signal. The INCREMENT signal pulse tells address generator 26 to increment its current memory address output ADDR, thereby incrementing the current input address to instruction memory 22 and vector memories 18 of FIG. 1.

CALL

A CALL opcode invokes a subroutine referenced by the accompanying call ID by telling sequencer 24 to carry out the following sequence of activities:
1. pulse the SAVE signal to tell register 30 to save the incremented current address (ADDR+1), then
2. pulse the PUSH signal to tell stack 32 to push the address stored in register 30 onto its stack, and then
3. pulse the LOAD_CALL signal to tell address generator 26 to set its current address ADDR to the CALL_ADDR output of RAM 28.

Thus a CALL opcode tells instruction processor 20 to save the address following the current address in stack 32 for later use as a return address and to jump to the first address of a subroutine referenced by the call ID included in the instruction with the CALL opcode.

RETURN

A RETURN opcode appearing at the end of a subroutine tells sequencer 24 to return from a subroutine call by carrying out the following sequence of activities:
1. pulse the LOAD_RETURN signal to tell the address generator 26 to set the current address ADDR to the return address RETURN_ADDR currently on the top of stack 32, and then
2. pulse the POP signal to tell stack 32 to pop the return address (RETURN_ADDR) off its stack.

Thus a RETURN Opcode tells instruction processor 20 to jump to a return address that is one greater than the address of the call instruction and to then push the return address off stack 32.

TEMP

A temporary return (TEMP) opcode in accordance with the present invention may be included at any point of a main routine or a subroutine and tells sequencer 24 to carry out the following sequence of activities:
1. pulse the SAVE signal to cause register 30 to save the incremented current address (ADDR+1), then
2. pulse the LOAD_RETURN signal to tell address generator 26 to set the current address ADDR to the return address RETURN_ADDR, then
3. pulse the POP signal to tell stack 32 to pop the return address RETURN_ADDR off the stack, and then
4. pulse the PUSH signal to push the address stored in register 30 onto the stack as the next return address.

Thus the temporary return opcode TEMP acts like a RETURN opcode in that it causes instruction processor 20 to return to a previously saved return address. However unlike a conventional RETURN opcode, the temporary return opcode TEMP also tells the instruction processor to save the address following the TEMP opcode as a next return address. A temporary return opcode is used when we want to tell instruction processor 20 to jump to some return address, but only "temporarily", because at some later time a subsequent instruction will ask the instruction processor to return the address following the TEMP opcode. The use of the temporary return opcode TEMP is best understood through example.

Figures 3, 4:
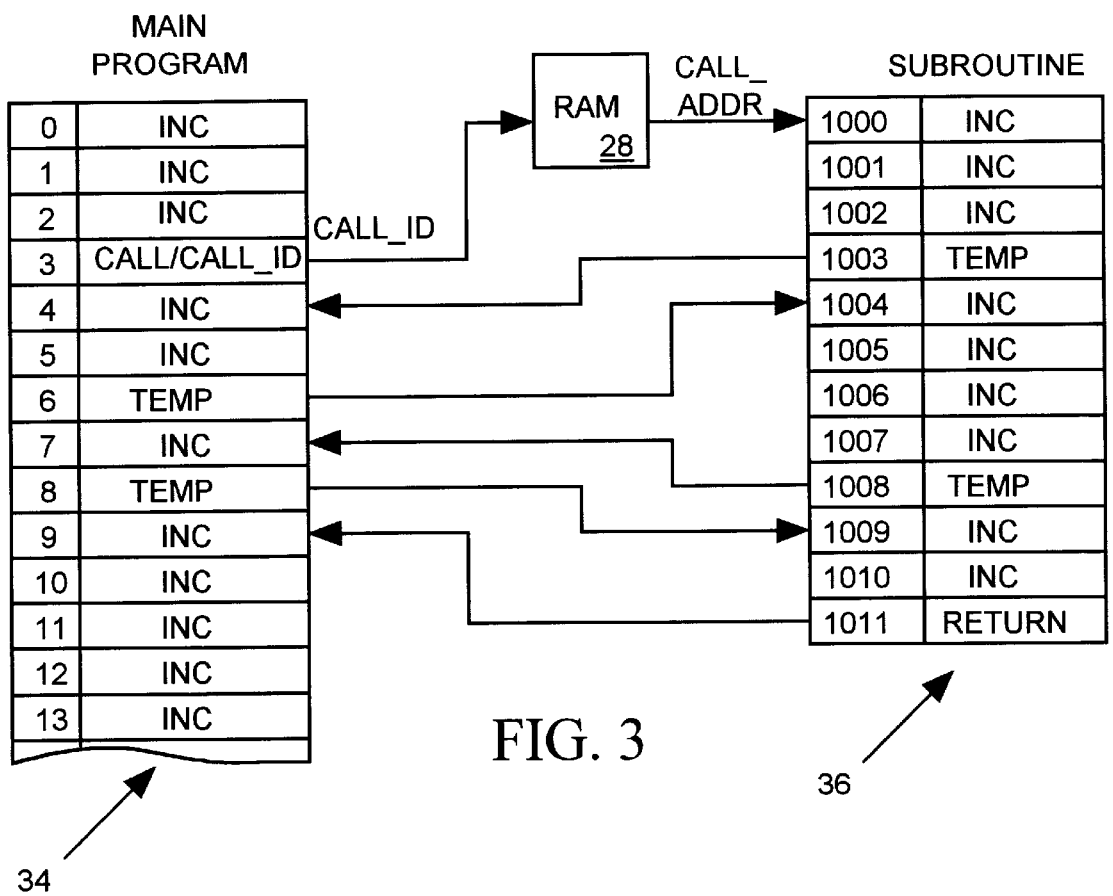

FIG. 3 illustrates a section 34 of the address space of instruction memory 22 of FIG. 1 (addresses 0–13, decimal) containing a first portion of a main program and another section 34 of the address space (for example addresses 1000–1011, decimal) of instruction memory 22 containing a subroutine that may be called by the main program.

Referring to FIGS. 1–3, the main program starts with an INC instruction stored at instruction memory address 0. Each vector memory 18 reads out a vector stored at address 0 and on a next pulse of the PCLK signal marking the start of the first test cycle, each channel 14 acquires its input vector and then carries out the test activity it indicates during the first test cycle.

The first pulse of the PCLK signal also tells sequencer 24 of instruction processor 20 to execute its input INC instruction. Accordingly, sequencer 24 signals address generator 26 to increment the current output address ADDR to 1. Each vector memory 18 thereupon reads out the vector stored at its address 1 and instruction memory 22 reads out the INC instruction stored at its address 1. On the next pulse of the PCLK signal marking the start of the second test cycle, each channel 14 acquires the vector read out of vector memory address 1 and sequencer 24 executes the INC instruction read out of instruction memory address 1. A similar process is repeated for the first three test cycles. Each vector memory 18 therefore reads out the vectors stored at its addresses 1, 2, and 3. However on reaching address 3, instruction memory 22 read out a CALL instruction instead of an INC instruction. RAM 28 converts the call ID included in that instruction into a call address (CALL_ADDR) pointing to the first address (1000) of subroutine 36.

On the next pulse of the PCLK signal, sequencer 24 signals address generator 26 to load the call address output of RAM 28 thereby causing the current address ADDR to jump to 1000. This causes each vector memory 18 to read out a vector stored at its address 1000 and causes instruction memory 22 to read out an instruction stored at its address 1000. The CALL opcode also tells sequencer 24 to load the ADDR+1 output (address 4) of adder 29 into register 30 and to signal stack 32 to push that address (address 4) onto its stack.

Since the first three instructions of the subroutine are INC instructions, the program steps through the next three address (1001–1003) for the next three cycles. Thus each vector memory 18 successively reads out vectors at its addresses 1000–1003. When the current instruction address reaches 1003, instruction memory 22 reads out a TEMP instruction. The TEMP instruction tells sequencer 24 to signal address generator 26 to set the current address ADDR to the return address (address 4) currently on the top of stack 32 and to pop that return address off the stack. The TEMP opcode also tells sequencer 24 to push the next address (1004) of the subroutine onto the stack so that the program can return to that address later.

At this point the current address is set to 4, and each vector memory 18 reads out the vector stored at its address 4. Since INC instructions are stored at addresses 4 and 5, instruction processor 20 sequentially steps through addresses 5 and 6. On reaching address 6, the main program reads out another TEMP instruction. This tells sequencer 24 to signal address generator 26 to set the current address to the return address (address 1004) at the top of stack 32, to pop address 1004 off the stack and to then push address 7 onto the stack. Program flow then steps through the set of INC instructions stored at subroutine addresses 1004–1007. When program flow reaches address 1008, sequencer 24 signals address generator 26 to set the current address to the return address (7) at the top of the stack, to pop address 7 off the stack, and to then push address 1009 onto the stack.

TEMP instructions continue shift program flow back and forth between the main program and the subroutine until the program encounters a RETURN instruction at the end of the subroutine (address 1011). The RETURN instruction tells sequencer 24 to return to a return address (address 9) at the top of the stack and to pop address 9 off stack 32. However, unlike a TEMP instruction, the RETURN instruction does not tell sequencer 24 to push address 1012 onto stack 32.

Certain types of tests require repeated generation of a long sequence of vectors that is "mostly repetitive" in the sense that only a few vectors of the sequence change on each pass of the sequence. The TEMP instruction enables the program to employ a single subroutine to invoke the repetitive portions of a "mostly repetitive" vector sequence while temporarily returning to the main program when necessary to invoke non-repetitive portions of a vector sequence.

For example when the DUT to be tested is a random access memory, we write data to each DUT memory address, read the data back out of that DUT address, and then compare the data written to the DUT address to the data read back out to see if they match. The process of writing, reading and comparing is highly repetitive except that the DUT memory address being write and read accessed changes for each repetition of the process. Thus the vectors sent to the channels that drive DUT address input have to change during each repetition of those portions of the process in which the DUT address is set.

In order to handle this "mostly repetitive" process, we could divide the process into several subroutines, each covering those portions of the process which are completely repetitive. The non-repetitive portions of the process, the generation of DUT write and read addresses, could be handled by the main program which would use conventional calls to subroutines when needed to carry out the repetitive portions. However since several different subroutines would be needed to implement one mostly repetitive process, and since calls to only a limited number of subroutines can be made during a test when indirect subroutine addressing is employed, breaking a mostly repetitive process into several subroutines uses up scarce subroutine call resources.

The TEMP instruction enables a mostly repetitive process to be implemented using a single subroutine call instead of several. As illustrated in FIG. 3, a TEMP instruction can be inserted into the subroutine to direct operation back to the main program whenever there is a need to execute a non-repetitive portion of the process. In a sense, the TEMP instruction allows the main program to "pass" parameters to the subroutine at various points during the subroutine. Without the use of TEMP instructions, the portions of the process carried out by the single subroutine call illustrated in FIG. 3 would have to be handled by three separate subroutine calls, thereby using up three of the total of sixteen possible indirect call addresses (call IDs).

In an alternative embodiment of instruction processor 20 of FIG. 2, the CALL opcode and CALL_ID operand are stored at two successive addresses of instruction memory 22 instead of one. The CALL_ID opcode arrives at sequencer 24 during the test cycle following the CALL opcode. This embodiment of instruction processor 20 employs an instruction processor topology similar to that illustrated in FIG. 2, however sequencer 24 responds to CALL instructions in a slightly different manner. In the alternative embodiment sequencer 24 initially responds to a CALL instruction in the same way it responds to an INC instruction, by pulsing the INCREMENT signal, thereby telling address generator 26 to simply increment the current address. There is no immediate jump to a subroutine address because the instruction processor has not yet received the subroutine CALL_ID. Thus in the test cycle following the CALL opcode, each vector memory 18 reads out the vector at the next address.

However the incremented address now tells instruction memory 22 to read out the CALL_ID operand, and RAM 28 converts the indirect CALL_ID address to a direct call address CALL_ADDR. On the next pulse of the PCLK signal, sequencer 24 pulses the SAVE signal to save the return address, pulses the LOAD_CALL signal to tell address generator 26 to set the current address to the call address CALL_ADDR and pulses the PUSH signal to push the return address onto stack 32.

FIG. 4 illustrates a main program for the alternative embodiment of instruction processor 20 that produces the same result as the main program of FIG. 3. Note that the INC and CALL/CALL_ID instructions at address 2 and 3 of the main program of FIG. 3 are replaced with the CALL and CALL_ID codes at addresses 2 and 3 of the main program of FIG. 4. However the sequence of addresses outputs ADDR produced by both programs is the same.

Thus, in the alternative embodiment, if we employ a 4-bit OPCODE, we can use the same four bits to represent a 4-bit CALL_ID operand. Since the same set of four bits are used to alternatively represent opcode and operand, we reduce the width of instruction memory 22. The only additional programming restriction imposed on the alternative embodiment is that because a CALL opcode operates like an INC opcode in the cycle in which it is received, an address jump caused by a call must always be preceded by an address increment and not by another address jump.

Figure 5:
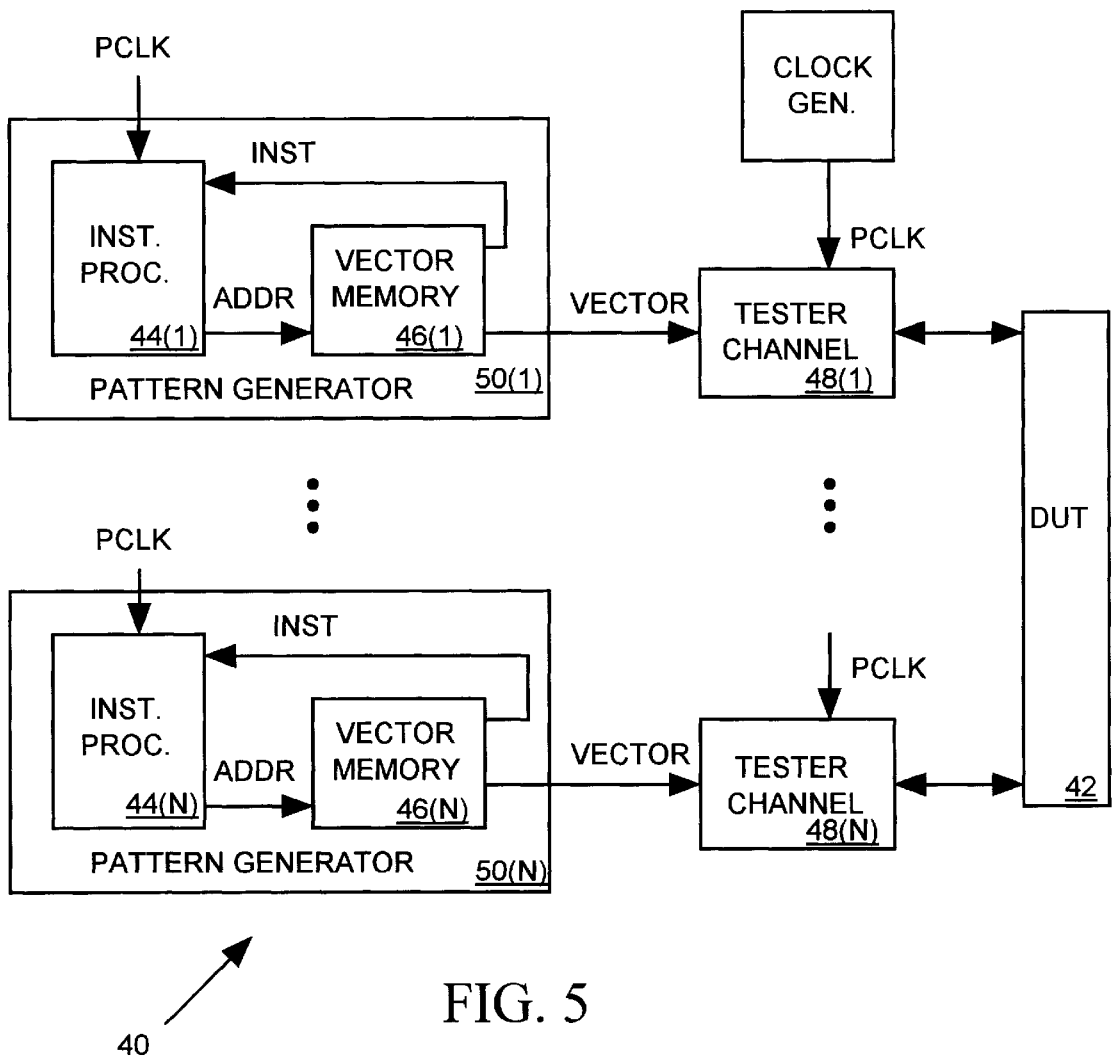

FIG. 5 illustrates an alternative embodiment 40 of the tester invention that is similar tester 10 of FIG. 1 but in which a separate instruction processor 44(1)–44(N) is provided addressing each vector memory 46(1)–46(N). Each vector memory 46 of tester 40 of FIG. 5 stores both a vector and an instruction at each address. The instruction output of each memory 46(1)–46(N) is fed back to the corresponding instruction processor 44(1)–44(N) while the vector is supplied to a corresponding one of tester channels 48(1)–48(N) driving pins of DUT 42. Each instruction processor 44 is similar to instruction processor 20 of FIG. 2 in both construction and operation. Each instruction processor 44 and vector memory 46 pair operate as a separate pattern generator 50(1)–50(N) to independently supply a sequence of vectors to the corresponding tester channel 48(1)–48(N). Tester 40 of FIG. 5 is more flexible than tester 10 of FIG. 1 because it allows each vector memory 46 to be independently addressed during the test.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An instruction processor (20) for responding to each input instruction of a sequence of input instructions by changing a value of an output address (ADDR), the instruction processor comprising:

stack means (32) for saving a return address when signaled to do so by an input PUSH signal and for discarding a saved return address when signaled to do so by an input POP signal, and processing means (24, 26, 29, 30) for responding to at least one of said instructions (TEMP) by changing said output address from a current value to a value of a return address previously saved by said stack means, by generating a new return address, by signaling said stack means via said POP signal to discard the previously saved return address, and by signaling said stack means via said PUSH signal to save said new return address.

2. The instruction processor in accordance with claim 1 wherein said processing means generates said new return address by incrementing said current value of said output address.

3. The instruction processor in accordance with claim 2 wherein said processing comprises:

an address generator (26) for generating said output address, for incrementing said output address in response to an input INCREMENT signal, and for setting said output address to a return address saved by said stack means in response to an input LOAD_RETURN signal;

an incrementer (29) for incrementing said output address generated by said address generator to produce an incremented address (ADDR+1);

storage means (30) for storing the incremented address produced by said incrementer in response to an input SAVE signal; and sequencing means (24) for receiving each instruction read out of said instruction memory and for controlling said PUSH, POP, INCREMENT and LOAD_RETURN signals in accordance with said received instructions.

4. The instruction processor in accordance with claim 3 wherein in response to said at least one instruction, said sequencing means sends said SAVE signal to said storage means causing it to store said incremented address, then sends said LOAD_RETURN signal to said address generator causing said address generator to set said output address to a return address saved by said stack, then sends said POP signal to said stack causing it to discard the saved return address, and then sends a PUSH signal to said stack causing it to save the incremented address stored by said storage means and to supply it as a new return address input to said address generator.

5. The instruction processor in accordance with claim 4 wherein at least one of said instructions is a CALL instruction, wherein in response to said CALL instruction said sequencing means sends said SAVE signal to said storage means causing it to store said incremented address, then sends a LOAD_CALL signal to said address generator causing said address generator to set said output address to a call address supplied as input thereto, and then sends a PUSH signal to said stack causing it to save the incremented address stored in said register means and to supply it as a new return address input to said address generator.

6. The instruction processor in accordance with claim 5 wherein at least one of said instructions is a RETURN instruction, wherein said in response to said RETURN instruction, said sequencing means sends said LOAD_RETURN signal to said address generator causing said address generator to set the address input to said instruction memory to said return address supplied thereto, and then sends said POP signal to said stack causing it to discard said return address.

7. A pattern generator (23) comprising:

an instruction memory (22) for storing a plurality of addressable instructions (INST) and for reading out each instruction when addressed by an address (ADDR) supplied as input thereto, each instruction referencing a method of supplying a next address input to said instruction memory;

a vector memory (18) also addressed by said address (ADDR) supplied as input to said instruction memory, for storing a plurality of addressable vectors and for reading out each vector when addressed;

stack means (32) for saving a return addresses when signaled to do so by an input PUSH signal and for discarding a saved return address when signaled to do so by an input POP signal; and processing means (24, 26, 29, 30) for responding to each input instruction read out of said instruction memory by changing a current value of said address (ADDR), wherein said processing means responds to at least one of said instructions (TEMP) by changing said output address from a current value to a value of a return address previously saved by said stack means, by generating a new return address, by signaling said stack means via said POP signal to discard the previously saved return address, and by signaling said stack means via said PUSH signal to save said new return address.

8. The pattern generator in accordance with claim 7 wherein said processing means generates said new return address by incrementing said current value of said address.

9. The pattern generator in accordance with claim 8 wherein said processing comprises:

an address generator (26) for incrementing said address in response to an input INCREMENT signal, and for setting said address to a return address saved by said stack means in response to an input LOAD_RETURN signal;

an incrementer (29) for incrementing said address generated by said address generator to produce an incremented address (ADDR+1);

storage means (30) for storing the incremented address produced by said incrementer in response to an input SAVE signal; and sequencing means (24) for receiving each instruction read out of said instruction memory and for controlling said PUSH, POP, INCREMENT and LOAD_RETURN signals in accordance with said received instructions.

10. The pattern generator in accordance with claim 9 wherein in response to said at least one instruction, said sequencing means sends said SAVE signal to said storage means causing it to store said incremented address, then sends said LOAD_RETURN signal to said address generator causing said address generator to set said address to a return address saved by said stack, then sends said POP signal to said stack causing it to discard the saved return address, and then sends a PUSH signal to said stack causing it to save the incremented address stored by said storage means and to supply it as a new return address input to said address generator.

11. The pattern generator in accordance with claim 10 wherein at least one of said instructions stored at one address of said instruction memory is a CALL instruction, wherein a call ID referencing a call address is stored at a next address of said instruction memory storing said CALL instructions, wherein said instruction processor further comprises means (28) for generating a call address referenced by an input CALL ID and for supplying said call address to said address generator, wherein when said CALL instruction is read out of said instruction memory said sequencing means responds to said CALL instruction by sending said INCREMENT signal to said address generator thereby causing said address generator to increment the address input to said instruction memory such that said instruction memory reads out said call_ID to said means for generating a call address, whereupon said sequencing means sends said SAVE signal to said storage means causing it to store said incremented address, then sends a LOAD_CALL signal to said address generator causing said address generator to set said address to said call address supplied thereto, and then sends a PUSH signal to said stack causing it to save the incremented address stored in said register means and to supply it as a new return address input to said address generator.

12. The pattern generator in accordance with claim 11 wherein at least one of said instructions is a RETURN instruction, wherein said in response to said RETURN instruction, said sequencing means sends said LOAD_RETURN signal to said address generator causing said address generator to set the address input to said instruction memory to said return address supplied thereto, and then sends said POP signal to said stack causing it to discard said return address.

13. The pattern generator in accordance with claim 10 wherein at least one of said instructions is a CALL instruction, wherein said instruction processor further comprises means (28) for generating a call address in response to an input CALL instruction and for supplying said call address to said address generator, wherein in response to said CALL instruction said sequencing means sends said SAVE signal to said storage means causing it to store said incremented address, then sends a LOAD_CALL signal to said address generator causing said address generator to set said address to said call address supplied thereto, and then sends a PUSH signal to said stack causing it to save the incremented address stored in said register means and to supply it as a new return address input to said address generator.

14. The pattern generator in accordance with claim 13 wherein at least one of said instructions is a RETURN instruction, wherein said in response to said RETURN instruction, said sequencing means sends said LOAD_RETURN signal to said address generator causing said address generator to set the address input to said instruction memory to said return address supplied thereto, and then sends said POP signal to said stack causing it to discard said return address.

15. An integrated circuit (IC) tester (10) comprising:

an instruction memory (22) for storing a plurality of addressable instructions (INST) and for reading out each instruction when addressed by an address (ADDR) supplied as input thereto, each instruction referencing a method of supplying a next address input to said instruction memory;

a vector memory (18) also addressed by said address (ADDR) supplied as input to said instruction memory, for storing a plurality of addressable vectors and for reading out each vector when addressed;

a tester channel (14) for receiving each vector read out of said vector memory and carrying out a test activity referenced by said vector;

stack means (32) for saving a return addresses when signaled to do so by an input PUSH signal and for discarding a saved return address when signaled to do so by an input POP signal; and processing means (24, 26, 29, 30) for responding to each input instruction read out of said instruction memory by changing a current value of said address (ADDR), wherein said processing means responds to at least one of said instructions (TEMP) by changing said output address from a current value to a value of a return address previously saved by said stack means, by generating a new return address, by signaling said stack means via said POP signal to discard the previously saved return address, and by signaling said stack means via said PUSH signal to save said new return address.

16. The IC tester in accordance with claim 15 wherein said processing means generates said new return address by incrementing said current value of said address.

17. The IC tester in accordance with claim 16 wherein said processing comprises:

an address generator (26) for incrementing said address in response to an input INCREMENT signal, and for setting said address to a return address saved by said stack means in response to an input LOAD_RETURN signal;

an incrementer (29) for incrementing said address generated by said address generator to produce an incremented address (ADDR+1);

storage means (30) for storing the incremented address produced by said incrementer in response to an input SAVE signal; and sequencing means (24) for receiving each instruction read out of said instruction memory and for controlling said PUSH, POP, INCREMENT and LOAD_RETURN signals in accordance with said received instructions.

18. The IC tester in accordance with claim 17 wherein in response to said at least one instruction, said sequencing means sends said SAVE signal to said storage means causing it to store said incremented address, then sends said LOAD_RETURN signal to said address generator causing said address generator to set said address to a return address saved by said stack, then sends said POP signal to said stack causing it to discard the saved return address, and then sends a PUSH signal to said stack causing it to save the incremented address stored by said storage means and to supply it as a new return address input to said address generator.

19. The IC tester in accordance with claim 18 wherein at least one of said instructions is a CALL instruction, wherein said instruction processor further comprises means (28) for generating a call address in response to an input CALL instruction and for supplying said call address to said address generator, wherein in response to said CALL instruction said sequencing means sends said SAVE signal to said storage means causing it to store said incremented address, then sends a LOAD_CALL signal to said address generator causing said address generator to set said address to said call address supplied thereto, and then sends a PUSH signal to said stack causing it to save the incremented address stored in said register means and to supply it as a new return address input to said address generator.

20. The IC tester in accordance with claim 19 wherein at least one of said instructions is a RETURN instruction, wherein said in response to said RETURN instruction, said sequencing means sends said LOAD_RETURN signal to said address generator causing said address generator to set the address input to said instruction memory to said return address supplied thereto, and then sends said POP signal to said stack causing it to discard said return address.

* * * * *